(12) United States Patent
Aubert et al.

(10) Patent No.: US 10,779,425 B2
(45) Date of Patent: Sep. 15, 2020

(54) ELECTRICAL APPARATUS COMPRISING A LOCKING DEVICE FOR AN ATTACHMENT RAIL

(71) Applicant: MERSEN France SB SAS, Saint-Bonnet-de-Mure (FR)

(72) Inventors: Laurent Aubert, Decines (FR); Olivier Soumillon, Bourgoin Jallieu (FR)

(73) Assignee: MERSEN FRANCE SB SAS, Saint-Bonnet-de-Mure (FR)

( * ) Notice: Subject to any disclaimer, the term of this patent is extended or adjusted under 35 U.S.C. 154(b) by 0 days.

(21) Appl. No.: 16/342,534

(22) PCT Filed: Oct. 23, 2017

(86) PCT No.: PCT/EP2017/076969
§ 371 (c)(1),
(2) Date: Apr. 17, 2019

(87) PCT Pub. No.: WO2018/077786
PCT Pub. Date: May 3, 2018

(65) Prior Publication Data
US 2019/0269026 A1    Aug. 29, 2019

(30) Foreign Application Priority Data
Oct. 24, 2016  (FR) ...................... 16 60283

(51) Int. Cl.
*H05K 5/02* (2006.01)
*H05K 5/03* (2006.01)
(Continued)

(52) U.S. Cl.
CPC ......... *H05K 5/0221* (2013.01); *H02B 1/0523* (2013.01); *H05K 5/0217* (2013.01); *H05K 5/03* (2013.01); *H05K 7/14* (2013.01)

(58) Field of Classification Search
CPC .......... H05K 5/0221; H05K 7/14; H05K 5/03; H05K 5/0217; H02B 1/0523
See application file for complete search history.

(56) References Cited

U.S. PATENT DOCUMENTS

| 8,066,239 | B2 * | 11/2011 | Molnar | .................. | H02B 1/052 |
| | | | | | 248/214 |
| 2008/0186657 | A1 * | 8/2008 | Weber | .................... | H02B 1/052 |
| | | | | | 361/673 |

FOREIGN PATENT DOCUMENTS

| CN | 1534842 A | 10/2004 |
| CN | 101088199 A | 12/2007 |

(Continued)

OTHER PUBLICATIONS

International Search Report for International Application No. PCT/EP2017/076969, dated Nov. 30, 2017, 4 pp.

(Continued)

*Primary Examiner* — Rockshana D Chowdhury
(74) *Attorney, Agent, or Firm* — Soquel Group LLC

(57) ABSTRACT

An electrical apparatus including a locking device for locking on an attachment rail, including a tab that is moveable along a first axis between a locking position and an unlocking position, a deformable blade which connects the tab to a central portion of the casing and which exerts a resilient return force on the tab, the tab including a locking member arranged in a side face of the tab projecting along a second axis perpendicular to the first axis, the electrical apparatus comprising, on an inner face of the cover, a housing, the locking member being movable between a retained position inside the housing and a released position outside the housing.

9 Claims, 9 Drawing Sheets

(51) Int. Cl.
*H05K 7/14* (2006.01)
*H02B 1/052* (2006.01)

(56) References Cited

FOREIGN PATENT DOCUMENTS

| CN | 101925281 | A | 12/2010 |
|----|-----------|---|---------|
| CN | 102473551 | A | 5/2012 |
| CN | 102800507 | A | 11/2012 |
| EP | 1775809 | A1 | 4/2007 |
| EP | 2264846 | A2 | 12/2010 |
| EP | 2528178 | A2 | 11/2012 |

OTHER PUBLICATIONS

INPI Rapport de Recherche Preliminaire for French Application No. 1660283, completed Feb. 13, 2017, 2 pp.
English Counterpart of Publication No. CN101925281A, US Publication No. 20100314522 A1, Dec. 16, 2010, 13 pp.
English Counterpart of Publication No. CN102800507A, US Publication No. 20120298490 A1, Nov. 29, 2012, 13 pp.

* cited by examiner

ELECTRICAL APPARATUS COMPRISING A LOCKING DEVICE FOR AN ATTACHMENT RAIL

CROSS-REFERENCE TO RELATED APPLICATIONS

This application claims benefit under 35 USC § 371 of PCT Application No. PCT/EP2017/076969 entitled ELECTRICAL APPARATUS COMPRISING A LOCKING DEVICE FOR AN ATTACHMENT RAIL, filed on Oct. 23, 2017 by inventors Laurent Aubert and Oliver Soumillon. PCT Application No. PCT/EP2017/076969 claims priority of French Patent Application No. 16 60283, filed on Oct. 24, 2016.

FIELD OF THE INVENTION

The invention relates to an electrical apparatus comprising a locking device for locking this electrical apparatus on an attachment rail.

BACKGROUND OF THE INVENTION

Electrical apparatuses are known, such as fuse holders, intended to be mounted on an attachment rail, for example within an electrical board. Such an apparatus generally comprises a bi-stable locking device, suitable for locking the electrical apparatus on the attachment rail or, alternately, unlocking the apparatus, so as to allow a movement of the apparatus relative to the attachment rail.

Typically, the known locking devices include a movable mechanical part that is attached on the casing of the apparatus. One drawback is that this involves the industrial manufacturing of the apparatus, since the mechanical part, generally made from a material different from the casing, must be manufactured separately from the casing, then next fastened on this casing.

Known from EP 2,528,178 A1 is an electrical apparatus that comprises a movable bi-stable locking device, made in a single piece with the casing of the apparatus.

This known locking device is provided with a tab that comprises, on one of its ends, a hook suitable for retaining a branch of the fastening rail and that also includes, on its opposite end, a curved maneuvering portion as well as a locking member. The locking member is arranged below the maneuvering portion and is suitable for keeping the tab in an unlocked position relative to the fastening rail. The maneuvering portion allows an operator to move the tab between the locked and unlocked positions.

This known apparatus is not, however, fully satisfactory. In particular, due to the configuration of the locking device, an operator must, in order to attach the apparatus on the attachment rail, i.e., to move the tab toward the locking position, move the maneuvering portion by pulling it toward him, i.e., toward a front face of the apparatus. Such a movement is not very intuitive, which increases the risk of incorrect maneuver and damage to the device. Such a movement is additionally inconvenient to perform when the space required for such a maneuver is insufficient, for example when the apparatus is mounted in an electrical board.

The apparatuses described in documents EP 2,264,846 A2, US 2008/186657 A1 and EP 1,775,809 A1 are also known.

SUMMARY OF THE DESCRIPTION

The invention more particularly aims to resolve this drawback by proposing an electrical apparatus provided with a locking device for locking on an attachment rail, this locking device being incorporated into the casing and having improved ergonomics, in which the switching of the locking device between locked and unlocked positions can be done more easily and more intuitively.

To that end, the invention relates to an electrical apparatus according to claim 1.

Owing to the invention, because the locking member protrudes on a lateral side of the tab, toward the outside of the apparatus, and the corresponding housing of the snapping part is arranged on the side cover of the apparatus, the movement of the tab toward the unlocked position can be done by an operator by pushing the maneuvering portion toward the back of the apparatus, without needing to pull the tab toward him. Such a movement is easier and more intuitive to perform than in the known state of the art, in which the maneuvering portion must be moved toward the front of the apparatus.

According to advantageous but optional aspects of the invention, such an electrical apparatus may incorporate one or more of the features of dependent claims 2 to 9.

BRIEF DESCRIPTION OF THE DRAWINGS

The invention will be better understood, and other advantages thereof will appear more clearly, in light of the following description of one embodiment of an electrical apparatus provided solely as an example and done in reference to the appended drawings, in which.

DETAILED DESCRIPTION

Figure 1:
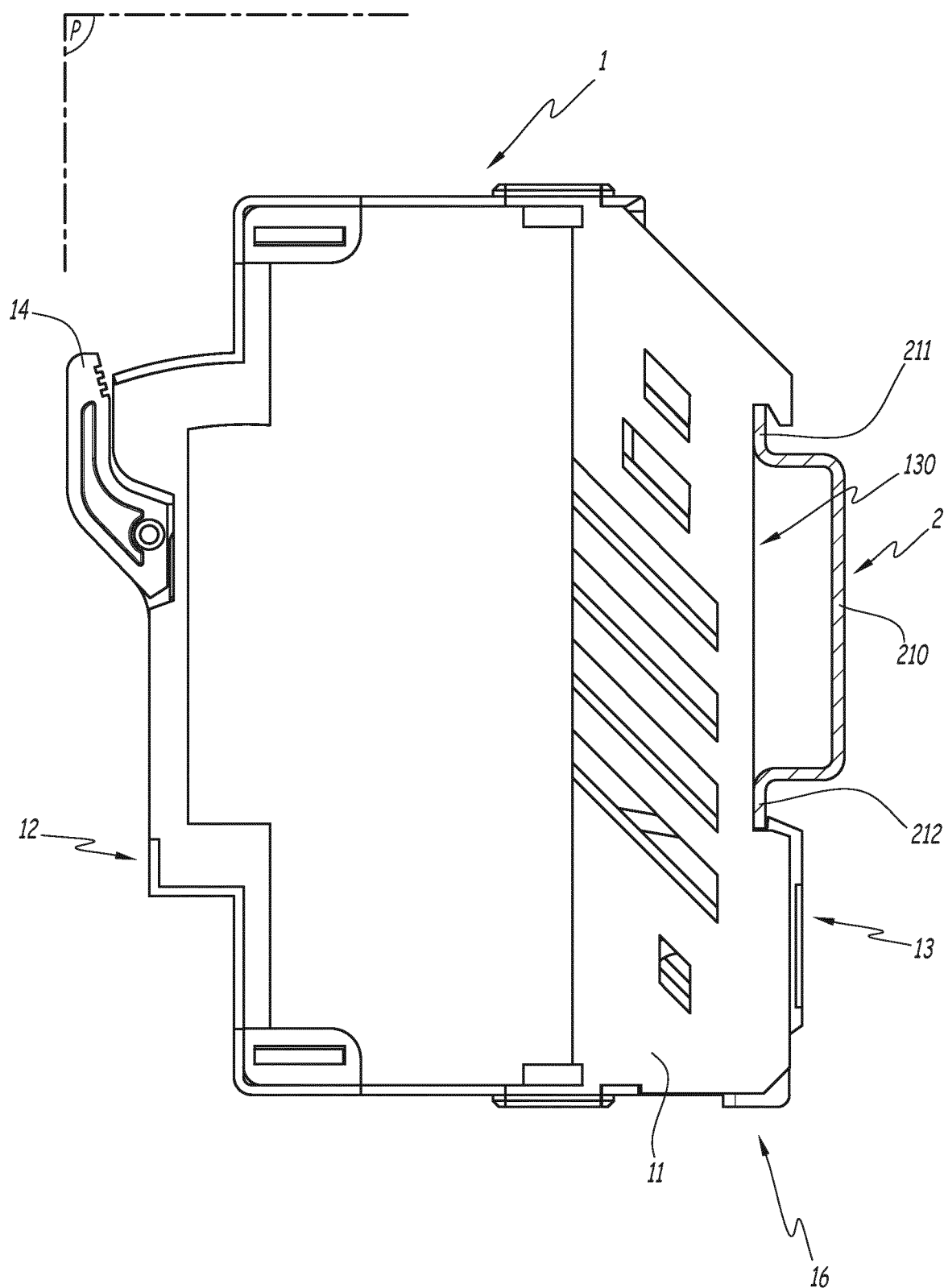
FIG. 1 is a schematic illustration, in side view, of an electrical apparatus according to the invention.

FIG. 1 shows an electrical apparatus 1, here a fuse holder. In a variant, the apparatus 1 can be an electrical switching apparatus, such as a circuit-breaker or a relay.

The apparatus 1 is intended to be attached, reversibly, on an attachment rail 2, for example within an electrical board.

The apparatus 1 includes a casing, a central part 10 of which is covered by side covers, one of which here bears reference 11. The casing is preferably made from a rigid plastic, for example polyamide 6.6.

The front and rear faces of the apparatus 1 respectively bear references 12 and 13.

The apparatus 1 here is provided, on its front face 12, with a tilting control lever 14 that includes a hollow body 140 suitable for receiving a fuse. The lever 14 is mounted pivoting around a shaft 141 that extends transversely relative to the apparatus 1. When the lever 14 is in a closed position, the fuse is located inside the casing and in contact with electrical terminals, not illustrated, of the apparatus 1. Such a fuse holder mechanism is well known and is not described in detail.

The apparatus 1 is also provided, on its rear face 13, with a receiving zone 130 for the rail 2. The zone 130 has a shape and dimensions complementary to those of the rail 2.

The rail 2 includes an essentially planar central part 210 and two end parts, called upper branch 211 and lower branch 212, that extend on either side of the central part 210 to allow the attachment of the apparatus 1.

As an example, fastening means, not illustrated, are arranged on the central part 210 in order to secure this rail 2 to a stationary support, for example to a wall of an electrical panel.

In this example, the rail 2 is an attachment rail of the "DIN" type, as defined by standard EN 50022. It is for example an attachment rail made from metal and with a height of 35 mm, defined by this standard and known under the name "Omega" or "top hat".

In this description, the attachment rail 2 extends longitudinally along an axis arranged horizontally.

Reference X1 denotes a stationary longitudinal axis of the apparatus 1. When the apparatus 1 is attached on the rail 2, the axis X1 is perpendicular to the longitudinal direction of the rail 2. Here, the axis X1 extends vertically.

References "Y1" and "Z1" denote stationary axes of the apparatus 1, both perpendicular to the axis X1. The axis Y1 extends transversely to the apparatus 1, here perpendicular to the two side faces of the apparatus 1. The axis Y1 thus forms a transverse axis of the apparatus. The axis Z1 here connects the front 12 and rear 13 faces of the apparatus 1. The axes Y1 and Z1 here extend horizontally.

It is thus understood that the axis Y1 is parallel to the longitudinal axis of the rail 2 when the apparatus 1 is mounted on the rail 2.

Reference "P" denotes a median geometric plane of the apparatus 1. The plane P here contains the axes X1 and Z1.

Hereinafter, the "lower part" of the apparatus 1 is the part located below the rail 2 when the apparatus 1 is attached to this rail 2. Likewise, "upper part" is the part of the apparatus 1 that is above the rail 2.

The apparatus 1 includes a stationary hook 15, arranged in one piece with the casing and located on an upper part of the zone 130. The hook 15 is suitable for cooperating with the upper branch 211 of the rail 2. For example, when the rail 2 is received in the zone 130, the hook 15 bears on a rear face of the upper branch 212.

As shown in FIGS. 2 to 6, the apparatus 1 also includes a bi-stable locking device 16, intended to allow the maintenance of the apparatus 1 on the rail 2. The locking device 16 is formed as a unit with the central part 10 of the casing, i.e., in a single piece with the casing, as explained hereinafter.

The locking device 16 is in particular provided with a movable hook 165, here suitable for cooperating with the lower branch 212 of the rail 2.

The locking device 16 is movable, selectively and reversibly, between two stable and separate positions, respectively called locked position and unlocked position.

In the locked position, the locking device 16 is suitable for keeping the apparatus 1 attached on the rail 2, when the rail 2 is received in the zone 130. In this position, when the rail 2 is received in the zone 130 and the hook 15 retains the upper branch 211 of the rail 2, the hook 165 is kept bearing on the lower branch 212 of the rail 2, here on the rear of this lower branch 212, so as to prevent the unhooking of the apparatus 1 from the rail 2. The apparatus 1 is then said to be attached on the rail 2.

In the unlocked position, the locking device 16 allows a movement of the apparatus 1 relative to the rail 2. For example, the hook 165 is located at a distance from the lower branch 212. The apparatus 1 can then be detached from the rail 2.

The locking device 16 also includes a tab 160 movable along the axis X1 between the locked and unlocked positions.

In this description, when reference is made to the movement of the locking device 16 between the locked and unlocked positions, it must be understood that it is the tab 160 that is moved between the locked and unlocked positions.

The tab 160 here includes an essentially planar main part that extends longitudinally along the axis X1, the main faces of which extend perpendicular to the axis Z1.

The side faces 1604 of the tabs 160 here extend perpendicular to the main faces and therefore perpendicular to the axis Y1. The side faces 1604 are defined as being the faces of the tab 160 that are turned sideways relative to the apparatus 1, i.e., that here are parallel to the geometric plane P.

The tab 160 further includes, on a lower part, a maneuvering portion 163 that here forms a curved part extending toward the front face 12, perpendicular to the main part, along the axis Z1. The maneuvering portion 163 is secured to the main part of the tab 160 and protrudes outside the casing of the apparatus 1, allowing it to be handled by an operator in order to control the movement of the tab 160, as explained hereinafter.

It is in particular understood that the maneuvering portion 163 illustrated in the figures is provided solely as an example and that alternatively, it may have a different appearance.

Figure 9:
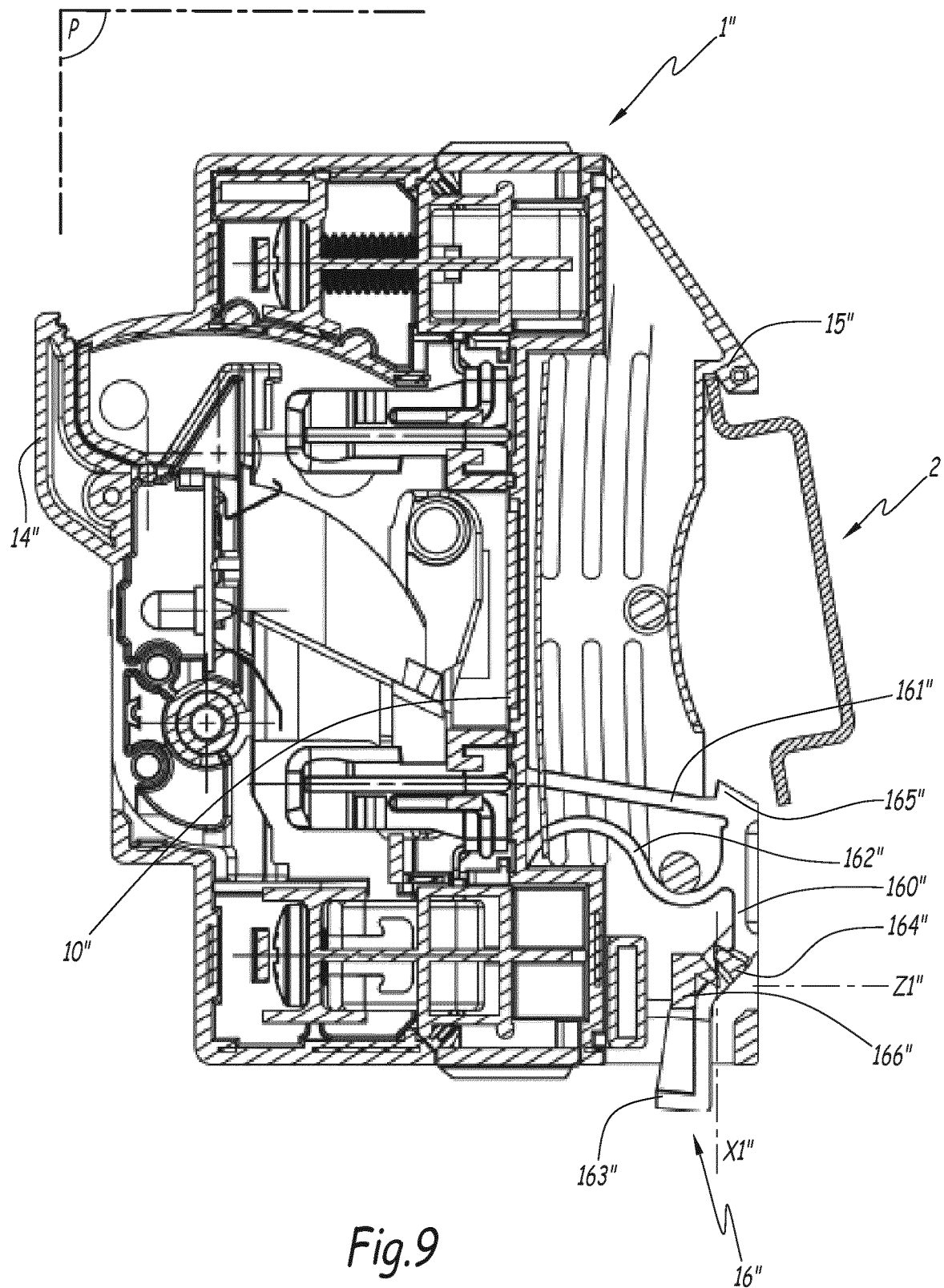
FIG. 9 schematically shows a variant of the apparatus of FIG. 2.

In particular, the maneuvering portion 163 may protrude outside the casing more than what is visible in FIGS. 1 to 6. For example, the maneuvering portion 163 protrudes relative to the base of the casing 10 by a distance greater than or equal to 1 cm or greater than or equal to 2 cm, this distance being measured here along the axis X1. Indeed, the more the maneuvering portion 163 protrudes from the casing of the apparatus 1, the more visible and accessible it is by a user, which makes it easier to manipulate. One such example maneuvering portion is illustrated in FIG. 9.

The tab 160 here is rigid and made from the same material as the casing.

The apparatus 1 also includes at least one resiliently deformable blade that mechanically connects the tab 160 to the main part 10 of the casing of the apparatus 1 and that is suitable for exerting a first resilient return force on the tab 160, by returning the tab 160 from the unlocked position to the locked position along the axis X1.

More specifically, here, the locking device 16 includes two such resiliently deformable blades 161 and 162.

The blade 161 here connects the main part 10 to an upper part of the main part of the tab 160, while the blade 162 connects the main part 10 to a lower part of the main part of the tab 160. Here, the hook 165 is arranged on the upper end of the tab 160, above the junction between the blade 161 and the tab 160.

The blade 161 is rectilinear and has a planar plate shape that extends essentially perpendicular to the main part of the tab 160, for example with an angle of less than or equal to 20° or 10° relative to the axis Z1.

Due to its articulation with the central part 10, the blade 161 exerts a first resilient return force along the axis X1, which tends to return the tab 160 toward its locked position.

The blade 162 has a curved shape, for example whereof the geometric projection in the plane P describes an "S" shape describing a first arc of circle facing the upper part of the apparatus 1, then a second arc of circle alongside the first arc of circle and oriented away from the first arc of circle, i.e., here facing the lower part of the apparatus 1. Thus, the blade 162 also contributes to exerting the first resilient return force.

The blades 161 and 162 here are superimposed on one another along the axis X1, the blade 161 here being placed over the blade 162.

Figure 2:
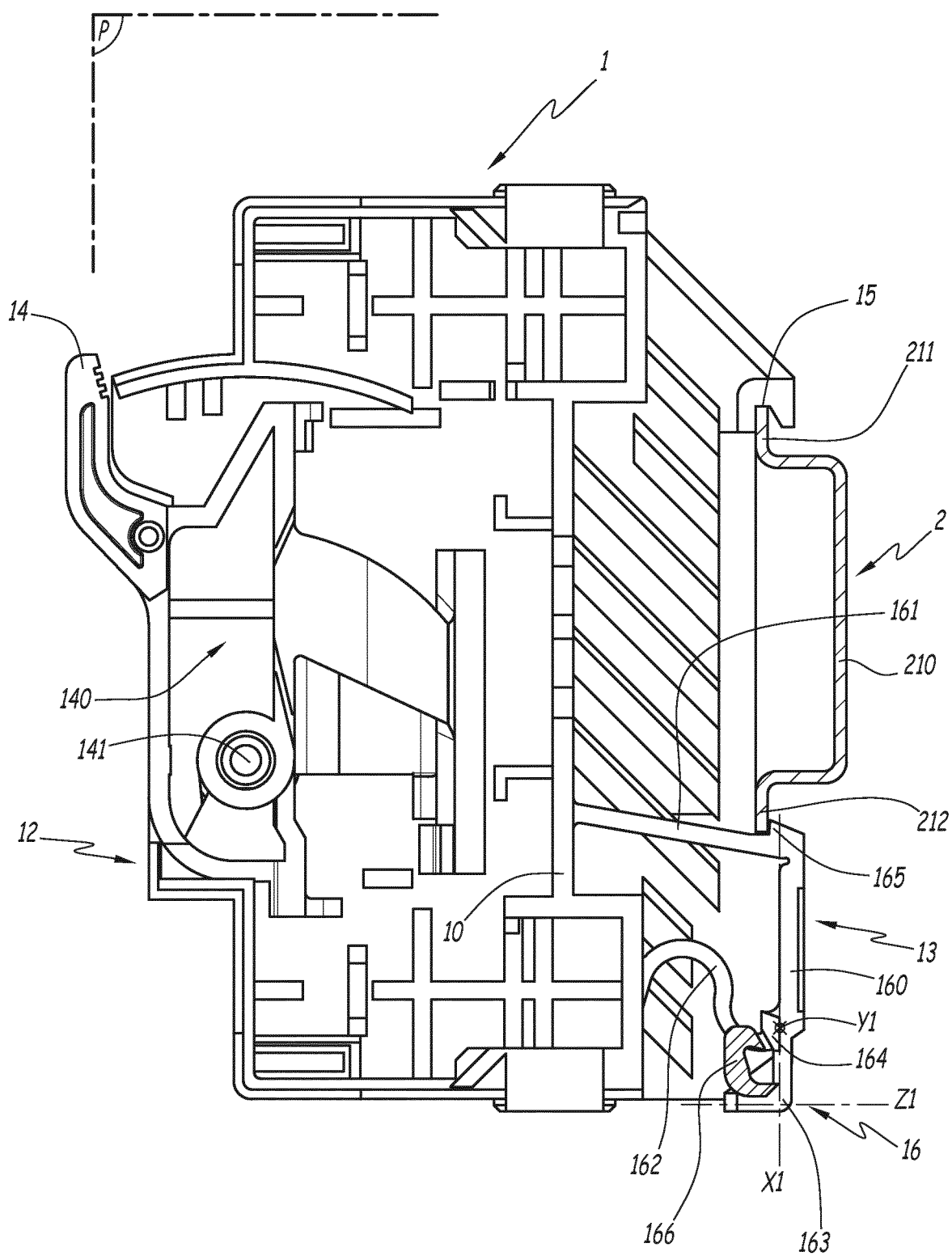
FIG. 2 is a schematic illustration, in longitudinal sectional view, of the electrical apparatus of FIG. 1.
Figure 3:
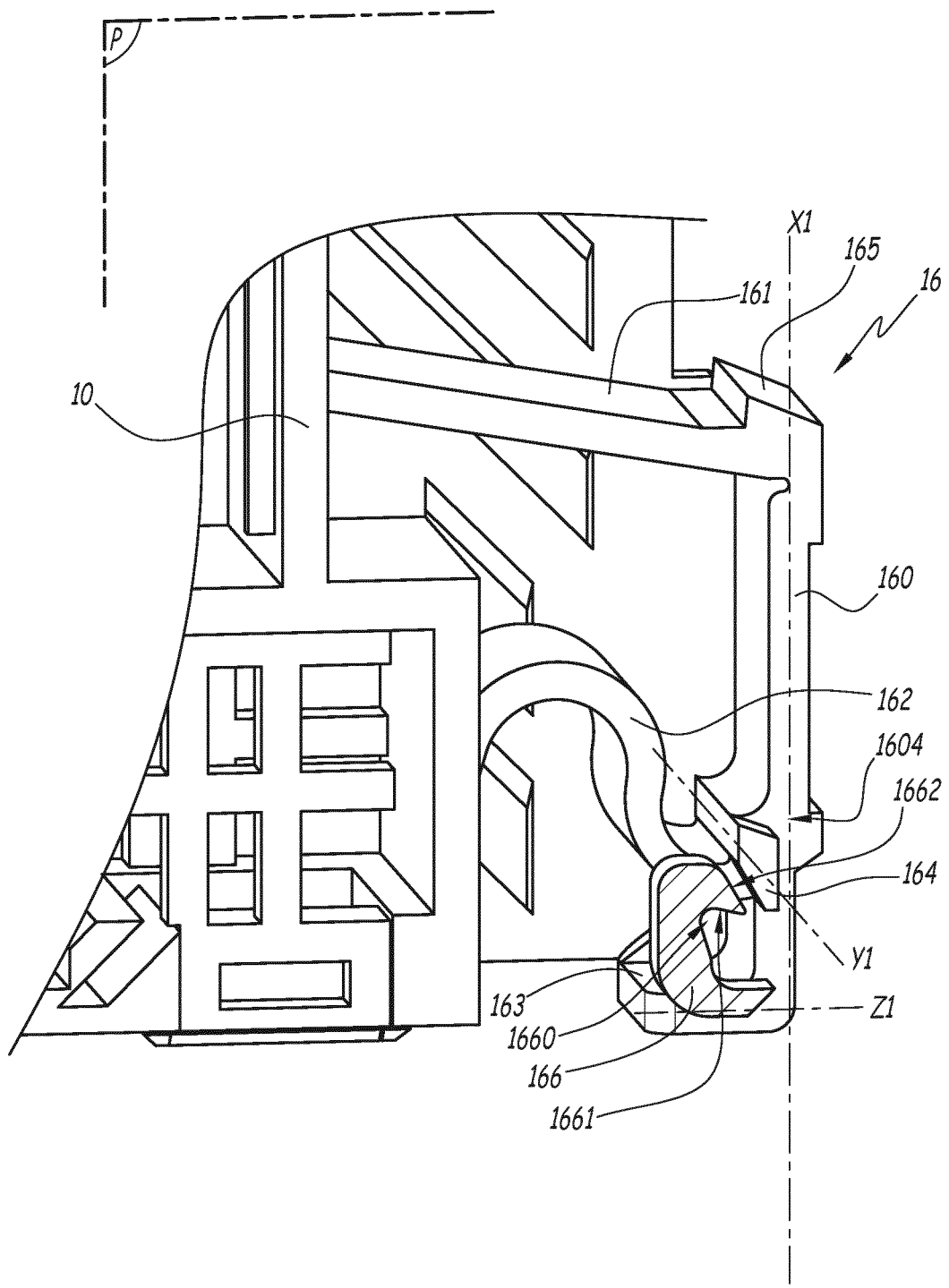
FIG. 3 is a schematic illustration, in tearaway perspective view, of a locking device of the electrical apparatus of FIG. 2.

It will be understood that the relative positions of the blades 161 and 162 illustrated in the figures are provided solely as an illustrative example. As a variant, in particular, the blades 161 and 162 can be closer to one another than what is illustrated in FIG. 2. For example, the blade 162 connects the main part 10 to the upper part of the main part of the tab 160, while being located below the blade 161. One such example is illustrated in FIG. 9.

The blades 161 and 162 are formed in a single piece with the tab 160 and with the main part 10 of the casing of the apparatus 1. Thus, the blades 161 and 162 are formed from a same material as the tab 160 and the main part 10 of the casing.

The tab 160 can undergo travel, resiliently, relative to the central part 10, along a travel direction parallel to the axis Z1. This travel here is allowed owing to the articulation between the blade 161 and the tab 160. The blade 162 exerts a second return force that returns the main part of the tab 160 aligned with the axis X1 when the tab 160 undergoes such travel parallel to the axis Z1.

The tab 160 is also provided with a locking member 164, also called snapping member.

The member 164 is arranged on a side face 1604 of the tab 160 and therefore protrudes, along the axis Y1, relative to this side face. As an example, the member 164 has a prismatic shape with a polyhedron-shaped base formed on the side face 1604. The axis Y1 here forms a longitudinal axis for this member 164. This shape may alternatively be chosen differently.

It is therefore understood from the preceding that the travel direction is perpendicular to the direction Y1 in which the member 164 protrudes.

Here, the member 164 has a height, measured relative to the side face 1604 and along the axis Y1, greater than or equal to 2 mm, or preferably greater than or equal to 5 mm.

This member 164 here is formed in one piece with the tab 160.

This member 164 here is situated at the junction between the blade 162 and the tab 160. However, this can be different depending on whether the blade 162 is positioned closer to or further from the blade 161.

The apparatus 1 also includes, arranged on an inner face of the side cover 11, a retaining wall 1661 that defines at least part of a housing 1660 with a shape complementary to the shape of the member 164. When the cover 11 is in a configuration assembled with the central part 10 of the casing, the inner face of the side cover 11 faces the member 164 and the housing 1660 is situated facing the member 164.

The member 164 is movable between a retained position inside the housing 1660 and a released position outside the housing 1660.

In the retained position, the member 164 is at least partially received inside the housing 1660. It then keeps the tab 160 in the unlocked position, preventing it from being translated along the axis X1 toward the locked position.

In the released position, the member 164 is located outside the housing 1660. The member 164 then allows the tab 160 to be translated along the axis X1.

In this example, the housing 1660 is arranged within a complementary part 166 that protrudes relative to the inner face of the cover 11, parallel to the axis Y1 and toward the member 164. For example, the complementary part 166 is formed in a single piece with the cover 11. The housing 1660 is in the shape of an open cavity, the projection of the inner walls of which in the geometric plane P here is in the shape of a "C". The housing 1660 has a shape corresponding to the contour of the member 164, so as to retain the member 164 in the housing 1660. The housing 1660 here is open toward the rear in order to allow the entry or, alternatively, the exit of the member 164 relative to the housing 1660.

The retaining wall 1661 here delimits an upper part of the housing 1660. The retaining wall 1661 is arranged to keep the member 164 bearing to prevent its movement, and therefore that of the tab 160, along the axis X1 toward the locked position, under the effect of the first return force, when the member 163 is received in the housing 1660.

The part 166 further includes an inclined outer wall 1662, here are arranged on an upper end of the part 166. The inclined wall 1662 is arranged to deviate the member 164 parallel to the axis Z1, toward the rear of the part 166, when the tab 160 moves along the axis X1 from its locked position toward its locked position [sic].

The member 164 here is movable between the retaining and released positions in particular by translation along the axis X1 and by travel parallel to the axis Z1.

The movement of the device 16 between its unlocked and locked positions here is intended to be done by an operator by acting on the maneuvering portion 163.

In this example, this action is done using a tool 3, such as a screwdriver, by inserting a tip 30 of the tool 3 into a housing 1630 delimited in part by the curved portion of the maneuvering portion 163. In a variant, this movement can be done manually, without using the tool 3.

Figure 4:
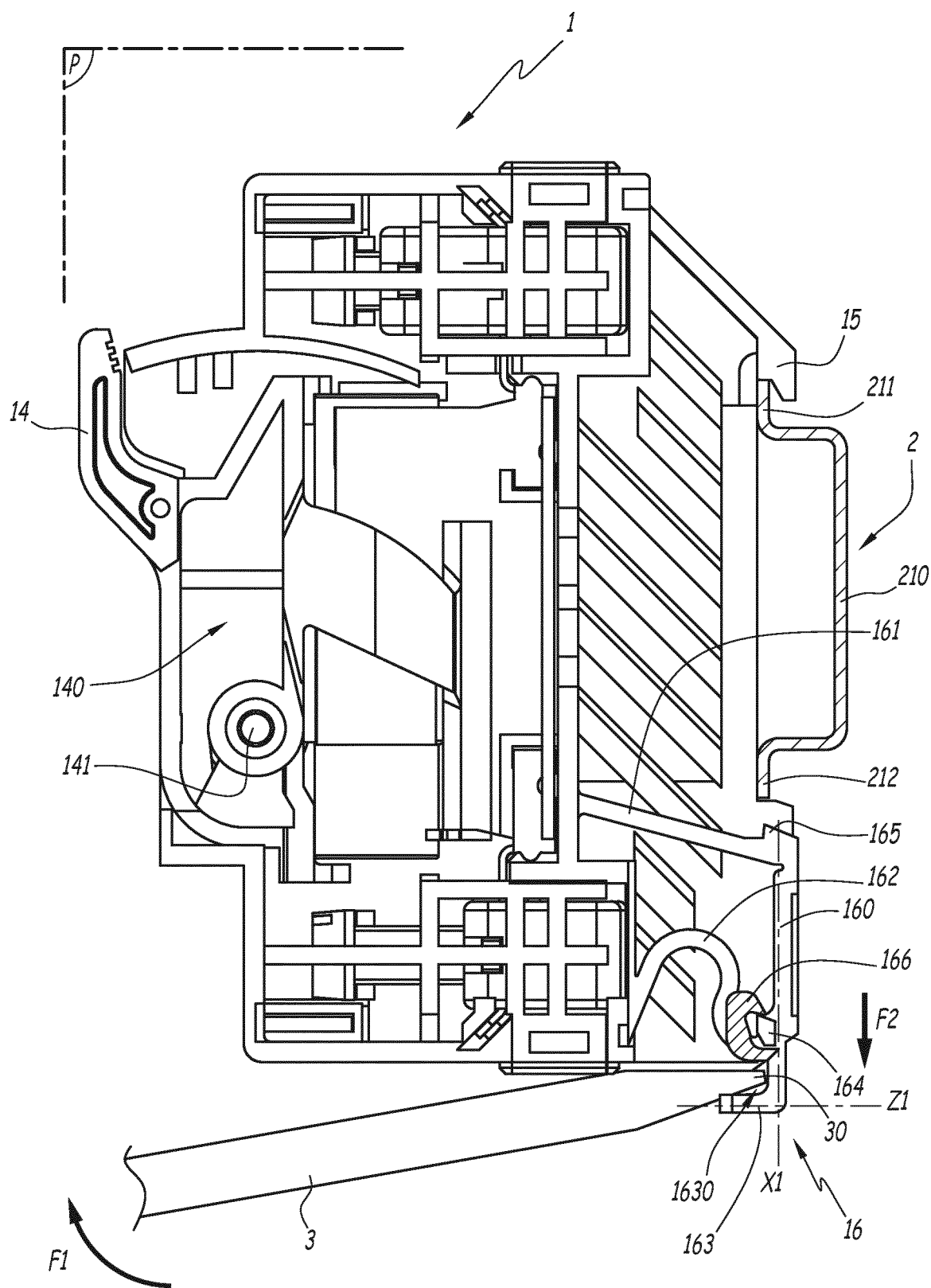
FIGS. 4 to 6 are schematic illustrations, in longitudinal sectional views, of the electrical apparatus of FIG. 2, illustrating the steps of the movement of the locking device between locked and unlocked positions.
Figure 5:
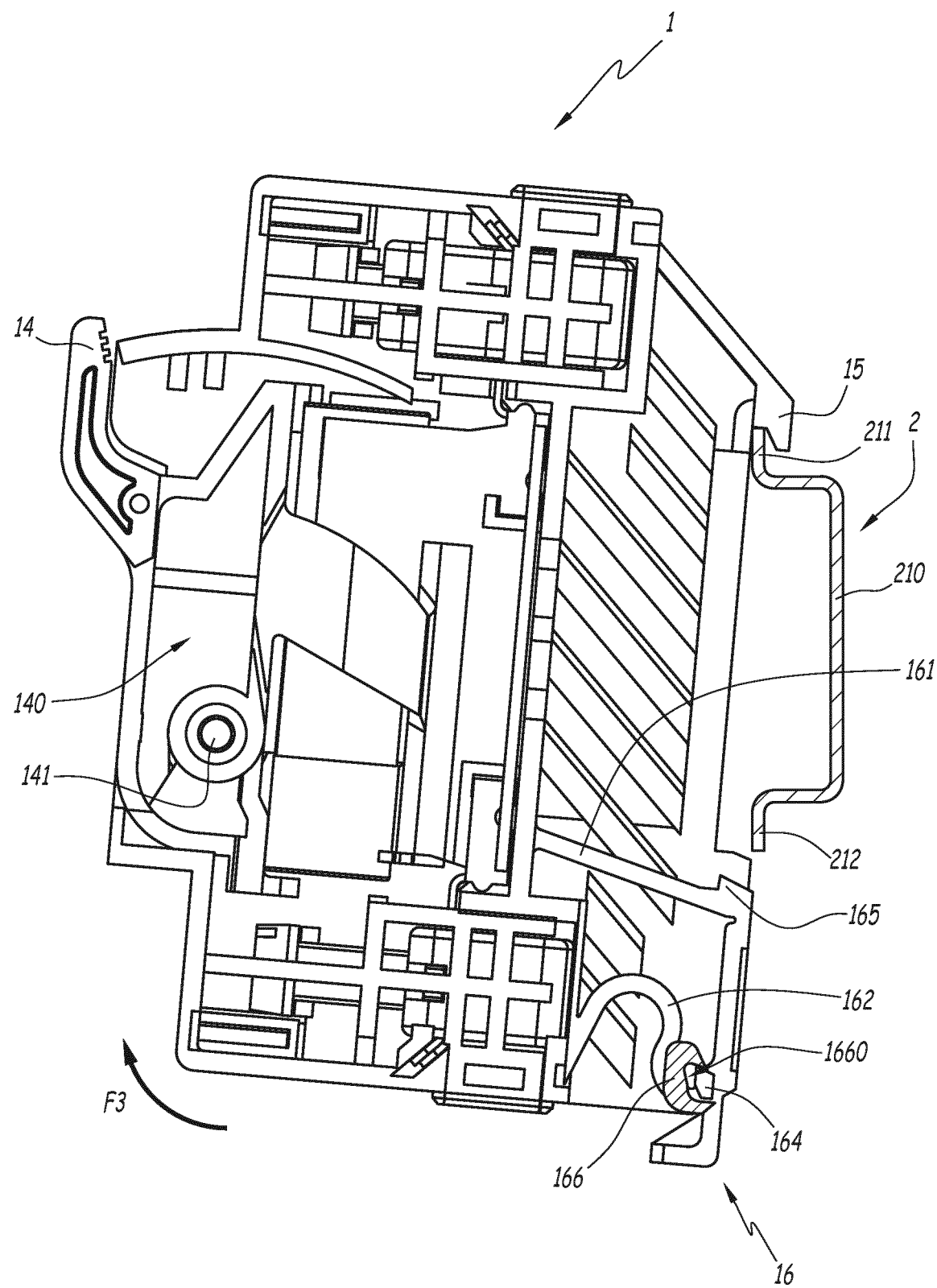

FIGS. 4 and 5 illustrate the steps of moving the apparatus 1 to unhook it outside the rail 2 on which it is initially fixed, with the device 16 initially in the locked position.

In FIG. 4, the device 16 is shown in the unlocked position, at the end of the movement, with a tool 3 whereof the tip 30 is inserted in the housing 163.

The movement of the device 16 from the locked position to the unlocked position is done by pulling the maneuvering portion 163 downward, to move the tab 16. This is done by exerting a translational force along the axis X1 using the tool 3, here by exerting a rotational torque illustrated by the arrow F1, by bearing on a lower base of the casing of the apparatus 1.

In so doing, the tab 160 moves along the axis X1, here downward, as illustrated by the arrow F2. The member 164 moves jointly with the tab 160 until reaching the part 166.

As the tab 160 continues to move along the arrow F2, the member 164 slides first over the inclined outer face 1662 of the part 166, then this face 1662 finds itself on its trajectory. This causes travel of the tab 160, and therefore of the member 164, along the direction of travel parallel to the axis Z1, here toward the rear of the part 166. Then, under the action of the second return force exerted by the blade 162, the member 164 is moved toward the front of the apparatus 1 and enters inside the housing 1660. The retaining wall 1661 then prevents any return of the tab 160 toward the locked position. The device 16 is thus maintained in the locked position, as illustrated by FIG. 4.

The apparatus 1 can then be unhooked from the rail 2, as illustrated in FIG. 5, by pivoting relative to the stationary hook 15, in the direction illustrated by arrow F3.

Figure 6:
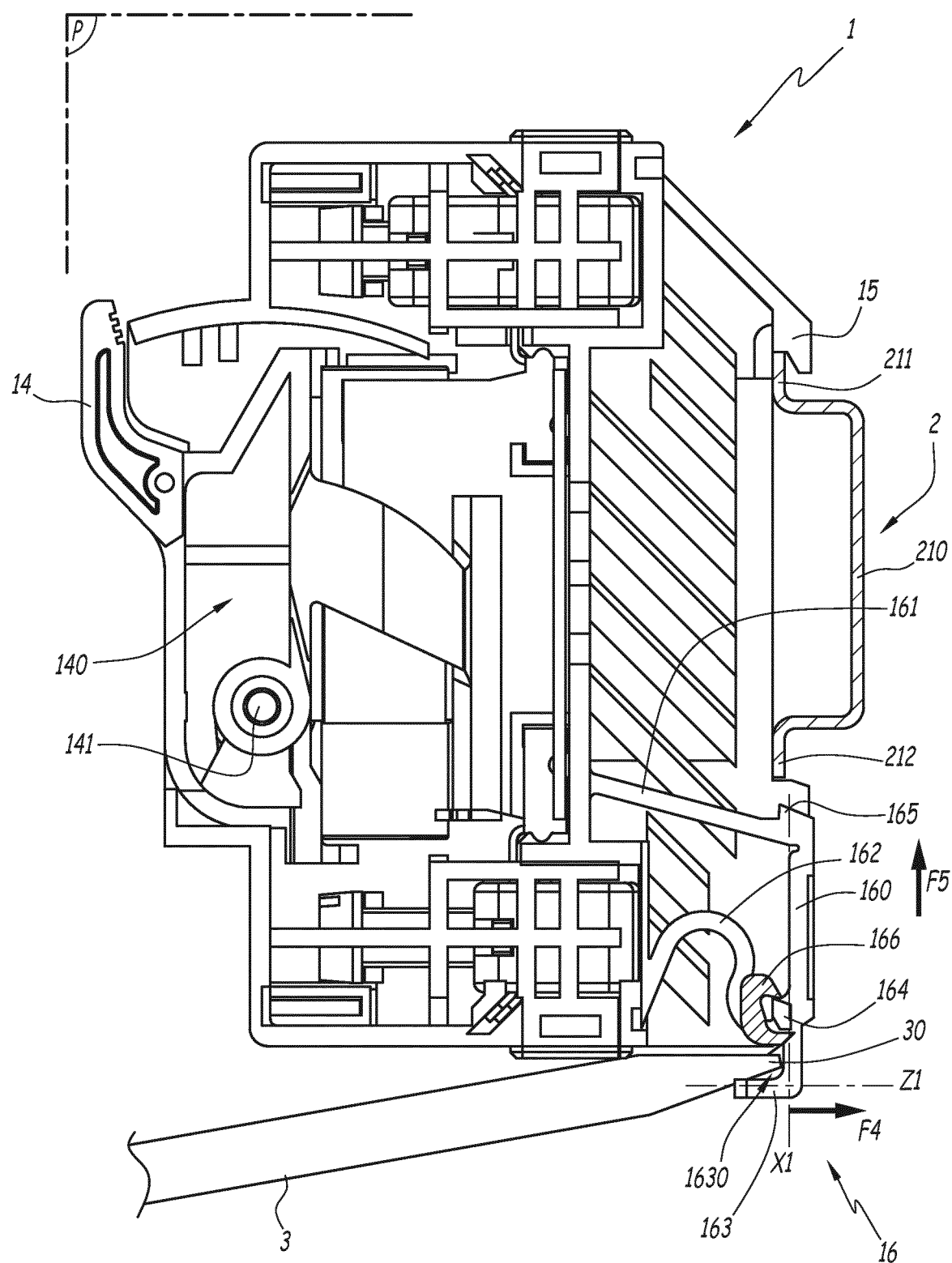

FIG. 6 illustrates a step for moving the device 16 from the unlocked position to the locked position, to attach it on the rail 2. The device 16 is initially illustrated in the unlocked position and the rail 2 is received in the zone 130 of the apparatus 1, and the upper branch 211 of the rail 2 is engaged with the stationary hook 15.

The movement of the device 16 toward the locked position is done by pushing the maneuvering portion 163 toward the rear of the apparatus 1, here in the direction illustrated by arrow F4. For example, this movement is done using the tip 30 of the tool 3. In a variant, this movement can be done manually, the tool 3 then being omitted.

In so doing, the member 164 is moved outside the housing 1660, toward its released position. The tab 160 is then returned parallel to the axis X1 and toward its locked position, under the effect of the first and second resilient return forces, until the hook 165 is engaged with the lower branch 212 of the rail 2. The device 16 is then in the locked position.

Owing to this configuration of the device 16, the movement toward the locked position is simpler and more intuitive for an operator to perform. The ergonomics of the device 16 are thus improved as a result. Furthermore, since the device 16 is made in a single piece with the casing of the apparatus 1, it is easier to manufacture than in the case where various mechanical parts must be attached on the casing to form the device 16.

According to one variant, the device 16 can be made on the upper part of the apparatus 1 in order to cooperate with the upper branch 211 of the rail 2. The stationary hook 15 is then made on the lower part of the apparatus 1 in order to cooperate with the lower branch 212 of the rail 2. The shape of the member 164 and the housing 1660 are then adapted accordingly. The direction of the arrows F2 and F4 is then reversed. For example, the device 16 is then arranged symmetrically, in a horizontal plane of symmetry, relative to the embodiment previously described.

Figure 7:
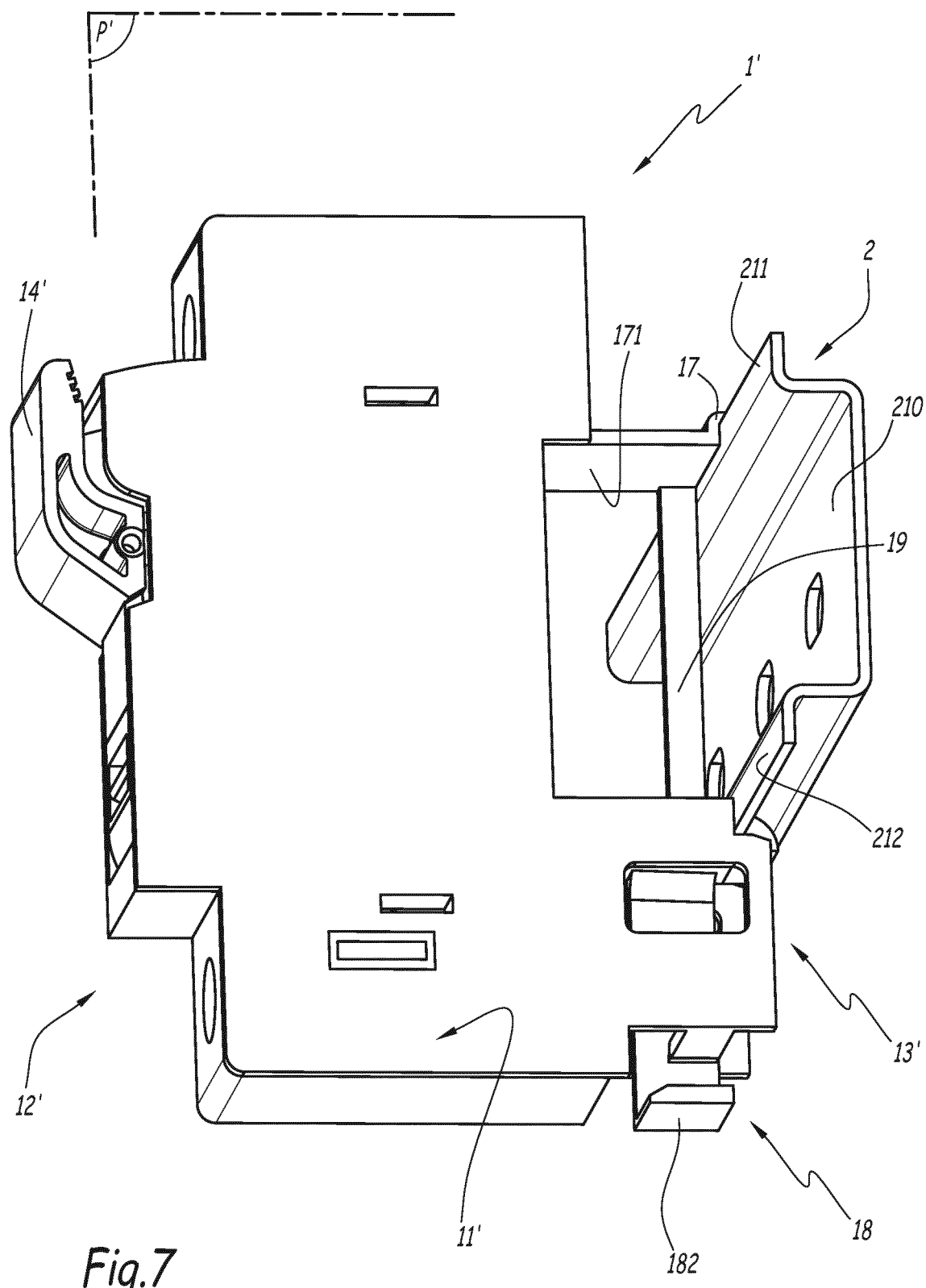
FIGS. 7 and 8 schematically show another embodiment of the electrical apparatus of FIGS. 1 to 6.
Figure 8:
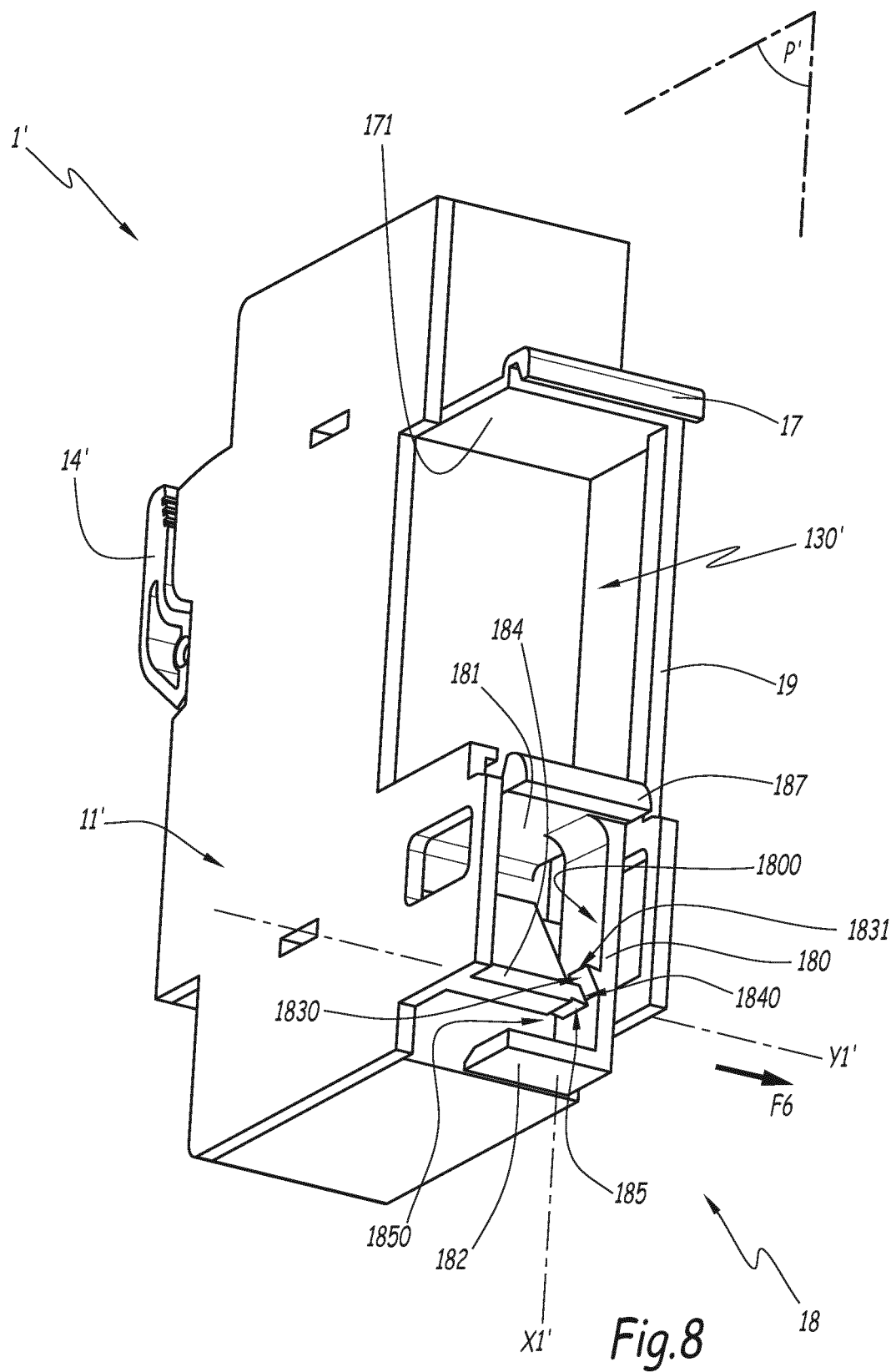

FIGS. 7 and 8 show an electrical apparatus 1' according to a second embodiment of the invention. The elements of the electrical apparatus according to this embodiment that are similar to the apparatus 1 according to the first embodiment bear the same numerical references increased by the symbol ' and are not described in detail, since the above description can be transposed to them.

In particular, references X1' and Y1' denote stationary axes similar to the axes X1 and Y1 of the apparatus 1, and P' denotes a median geometric plane similar to the plane P of the apparatus 1.

The apparatus 1' in particular differs from the apparatus 1 in that the locking device 16 is replaced by a locking device 18 that fulfills the same function. In particular, the device 18 is in a single unit with the central body of the casing of the apparatus 1'. Furthermore, the device 18 is bi-stable and movable between the locked and unlocked positions to attach the apparatus 1' on the rail 2.

In this apparatus 1', the hook 15 is further replaced by a stationary hook 17 that plays the same role as the hook 15. The hook 17 is arranged on a distal end of a stationary blade 171 that extends from a central part of the casing of the apparatus 1'. The blade 171 is optionally kept at a lower part of the casing by a vertical beam 19 that here extends parallel to the axis X1'.

The device 18 includes a tab 180 translatable along the axis X1' and that plays a role similar to the tab 160 with respect to the device 16. The tab 180 is thus movable between the locked and unlocked positions.

The tab 180 has an essentially planar main part that extends longitudinally along the axis X1' and a curved maneuvering portion 182 arranged on a lower part of the tab 180.

The maneuvering portion 182 forms a curved part extending perpendicularly and laterally relative to the tab 180, protruding relative thereto, parallel to the axis Y1'. The maneuvering portion 180 plays a role similar to the maneuvering portion 163.

The device 18 includes a resiliently deformable blade 181, for example similar to the blade 161, that mechanically connects the tab 180 to the main part of the casing of the apparatus 1. The blade 181 is suitable for exerting a first resilient return force on the tab 180, returning the tab 180 from the unlocked position to the locked position.

The blade 181 is rectilinear and has a planar plate shape that extends essentially perpendicular to the main part of the tab 180. A hook 187 is arranged on the distal end of said blade 187. The hook 187 performs a function similar to that performed by the hook 165 of the apparatus 1.

In this example, the tab 180 protrudes perpendicularly relative to a lower face of the blade 181. An upper end of the tab 180 is articulated with the lower face of the blade 181.

Thus, the tab 180, although rigid, can undergo travel, resiliently, relative to the blade 181, along a travel direction here parallel to the axis Y1'. The articulation of the tab 180 with the blade 181 exerts a second return force that returns the main part of the tab 180 aligned with the axis X1' when the tab 180 undergoes such travel.

The device 18 further includes a locking member 183, playing a role similar to the member 164. The member 183 is arranged on a side face 1800 of the tab 180, here in one piece with the tab 1800, and therefore protrudes, along the axis Y1', relative to this side face 1800. As an example, the member 164 includes an upper face 1831 particular the side face and also includes a lower face 1803 inclined relative to the side face of the tab 180.

The apparatus 1 also includes, arranged on an inner face of a lateral cover 11' of the casing, a housing 1850 with a shape complementary to the shape of the member 183, which plays a role similar to the housing 1660. When the cover 11' is in a configuration assembled with the central part of the casing of the apparatus 1, the inner face of the side cover 11' faces the member 183 and the housing 185 is situated facing the member 183.

In this example, the cover 11' includes a rigid beam 184 that protrudes relative to the inner face of the cover 11', parallel to the axis Y1'. This beam 184 includes the retaining wall 185 formed on a lower part of its distal end. Thus, the retaining wall 185 at least partially defines the housing 1850, intended to receive this member 183 to keep it in the retaining position.

The beam 184 here also includes, on its distal end, an inclined wall 1840 that allows the guiding of the member 183 when the tab 1830 moves toward its unlocked position along the axis X1. For example, the inclined wall 1840 is positioned across from the wall 1830.

The movement of the device 18 from its locked position to the unlocked position is done similarly to the movement of the device 16, by pulling the tab 180 downward along the axis X1, using the maneuvering portion 182, with or without a tool. In so doing, the member 183 moves along the axis X1 jointly with the tab 180 until it comes into contact with the end of the beam 184. It is then deflected sideways, along the axis Y1', by the inclined wall of the beam 184. Due to the resiliency of the tab 180 relative to the blade 181, the member 183 is brought toward its retained position below the beam 184, such that the face 1831 is in contact with the retaining wall 185.

The movement of the device 18 from its unlocked position toward the locked position is done by pushing the tab 180, using the maneuvering portion 182, either toward the rear of the apparatus or sideways along the axis Y1, as illustrated by arrow F6.

In this way, the member 183 is moved outside the housing toward its released position, away from the retaining wall 185. Thus, under the effect of the first resilient return force exerted by the blade 181, the tab 180 rises along the axis X1' toward the locked position, until the hook 187 engages the lower branch 212 of the rail 2. In parallel, the second return force returns the main portion of the tab 180 into alignment with the axis X1'.

Owing to this configuration of the device 18, the movement toward the locked position is simpler and more intuitive for an operator to perform. The ergonomics of the device 18 are here again improved.

According to one variant, similarly to what is described in reference to the device 16, the device 18 can be made on an upper part of the apparatus 1'.

In a variant, the apparatus 1 can include several copies of the locking device 16, for example when the dimensions of this apparatus 1 require several attachment points to one or several attachment rails 2. The same is true for the apparatus 1' in reference to the locking device 18.

FIG. 9 shows an electrical apparatus 1' according to a variant of the first embodiment of the invention. The elements of the electrical apparatus 1" that are similar to those of the apparatus 1 bear numerical references increased by the symbol " and are not described in detail, since the above description can be transposed to them. In particular, references X1" and Y1" denote stationary axes similar to the axes X1 and Y1 of the apparatus 1, and P" denotes a median geometric plane similar to the plane P of the apparatus 1.

In particular, the apparatus 1" is similar to the apparatus 1 and only differs by certain differences in shape and arrangement. In particular, the maneuvering portion 163" protrudes relative to the base of the casing of the apparatus 1". The blade 162" connects the main part 10" to the upper part of the main part of the tab 160", while being located below the blade 161".

Advantageously, the apparatus 1" includes one or several end-of-travel stops suitable for limiting the travel of the portion 163" along the axis X1" and/or along the axis Y1". This makes it possible to avoid an excessive movement of the portion 163" to avoid exceeding the elastic limit of the plastic material. The end-of-travel stop(s) can also be implemented on the apparatus 1 or on the apparatus 1'.

The embodiments and alternatives and embodiments considered above may be combined to create new embodiments.

The invention claimed is:

1. An electrical apparatus capable of being mounted on an attachment rail, comprising:
   a casing, comprising:
      a central part; and
      a side cover mounted on said central part; and
   a bi-stable locking device, comprising:
      a tab translatable along a first axis between a locked position, suitable for keeping the electrical apparatus attached on an attachment rail, and an unlocked position, suitable for allowing the movement of the electrical apparatus relative to the attachment rail; and
      a resiliently deformable blade that connects said tab to said central part of said casing and that is suitable for exerting a first resilient return force on said tab from the unlocked position toward the locked position,
   wherein said tab further comprises a locking member arranged on a side face of said tab and that protrudes relative to this side face along a second axis perpendicular to the first axis, this second axis forming a transverse axis of the apparatus,
   wherein the electrical apparatus comprises, arranged on an inner face of said side cover, a retaining wall that delimits at least part of a housing with a shape complementary to said locking member, the inner face facing said locking member and the housing being situated across from said locking member, and
   wherein said locking member is movable, by undergoing a resilient travel in a direction of travel perpendicular to the first axis and the second axis, between a retained position inside the housing, in which said retaining wall keeps said tab in the locked position, by preventing a movement of said locking member in translation along the first axis, and a released position outside the housing, in which said locking member allows a translational movement of said tab along the first axis.

2. The apparatus according to claim 1, wherein said tab is further able to undergo a resilient travel in the travel direction, said locking device comprising an additional deformable blade, connecting said tab to said central part of said casing, this blade being suitable for exerting a second return force on said tab in this travel direction when it undergoes such travel and to that end having a curved shape.

3. The apparatus according to claim 2, wherein said locking device further includes an inclined wall arranged to deflect said locking member in the travel direction when said tab moves toward the unlocked position.

4. The apparatus according to claim 2, wherein the second axis is parallel to a longitudinal axis of the attachment rail.

5. The apparatus according to claim 1, wherein said locking device comprises an additional part that protrudes relative to the inner face of said side cover along the second axis and that includes said retaining wall, the housing being arranged within the complementary part and having an open cavity shape.

6. The apparatus according to claim 1, wherein said locking device is made in one piece with said central part of said casing of the apparatus.

7. The apparatus according to claim 1, further comprising:
   a movable hook secured to said tab; and
   a stationary hook, the stationary hook and the movable hook being suitable for cooperating with branches of the attachment rail.

8. The apparatus according to claim 1, wherein said tab comprises a maneuvering portion protruding outside said casing for control of the movement of said tab by an operator.

9. The apparatus according to claim 1, wherein the apparatus is a fuse holder.

\* \* \* \* \*